United States Patent [19]

Kim

[11] Patent Number: 5,469,387
[45] Date of Patent: Nov. 21, 1995

[54] CIRCUIT FOR CLAMPING ENABLE CLOCK IN A SEMICONDUCTOR MEMORY DEVICE

[75] Inventor: Tae-hoon Kim, Seoul, Rep. of Korea

[73] Assignee: Goldstar Electron Co., Ltd., Cheongju, Rep. of Korea

[21] Appl. No.: 125,953

[22] Filed: Sep. 23, 1993

[30] Foreign Application Priority Data

Sep. 24, 1992 [KR] Rep. of Korea ............. 92-18223

[51] Int. Cl.⁶ ............................. H03K 5/08; G11C 7/00
[52] U.S. Cl. .................. 365/189.09; 365/203; 327/309; 327/534
[58] Field of Search ........................... 365/203, 233, 365/189.09, 226, 205, 222; 307/540, 296.2, 530, 296.8, 279; 327/309, 534, 51, 543, 192

[56] References Cited

U.S. PATENT DOCUMENTS

| | | | |
|---|---|---|---|
| 4,933,902 | 6/1990 | Yamada et al. | 365/189.08 |
| 4,964,082 | 10/1990 | Sato | 365/189.09 |
| 4,985,869 | 1/1991 | Miyamoto | 365/226 |
| 5,305,270 | 4/1994 | Kim | 365/203 |

Primary Examiner—William L. Sikes
Assistant Examiner—Tiep H. Nguyen
Attorney, Agent, or Firm—Alan R. Loudermilk

[57] ABSTRACT

A circuit for a clamping an /RAS signal in a DRAM. The bit line pre-charge generator is activated after the set-up of the VBB voltage, so that /RAS signals may be supplied to the chip after the bit line pre-charge voltage (VBLP) has reached the desired level, thereby preventing malfunction of the sense amplifiers. The circuit includes: a VBB sensor for producing VBB set-up signal S1 when a back bias voltage VBB in the semiconductor memory device has reached a desired level; a power-up generator for producing a power-up signal S2 when power in the semiconductor memory device is set-up; a VBLP generator for generating a bit line pre-charge voltage VBLP; a VBLP controller for holding the VBLP voltage to a ground voltage level according to the S1 and S2 signals; a VBLP sensor for generating VBLP set-up signal S3 when the VBLP voltage has reached a desired level; a /RAS pass signal generator for producing a /RAS pass signal S4 according to the S3 and S2 signals; a NOR circuit for controlling the transmission of the /RAS signals according to the S4 signal.

18 Claims, 3 Drawing Sheets

CIRCUIT FOR CLAMPING ENABLE CLOCK IN A SEMICONDUCTOR MEMORY DEVICE

FIELD OF THE INVENTION

The present invention relates to circuits for clamping an enable clock (the term "enable clock" refers to signals such as row address strobe signals called "/RAS"; hereinafter /RAS is used to refer to the enable clock) in semiconductor memory devices during the initial set-up of the row address strobe signals of the semiconductor memory devices, wherein the /RAS signals as the main signals of the chip are supplied only after the last charged bit line pre-charge voltage (VBLP) has reached the desired level.

BACKGROUND OF THE INVENTION

As illustrated in FIG. 1, a conventional circuit for clamping the /RAS ("/" means bar) signals includes: VBB sensor 1 for detecting whether the voltage produced during the generation of a back bias voltage (VBB) has reached the desired level; transistor (MP1) 3 and ring oscillator 2 for driving charge pump 4 until the desired VBB level is reached; inverter 6 and latch circuit 5 for preventing the driving of NOR circuit 7; NOR circuit 7 maintains the clock on signal "LOW" during the initial period of setting up the VBB, and NOR circuit 7 transmits the clock-on signal in response to the /RAS signal after the VBB has been initially set up.

Latch circuit 5 includes two NOR gates, NOR1 and NOR2, to receive signals from VBB sensor 1 and power-up generator 8, and NOR circuit 7 receives the /RAS signal and the output of inverter 6.

NOR circuit 7 comprises two PMOS transistors, MP2, MP3, and two NMOS transistors, MN1, MN2. The MP2, MP3 and MN2 transistors are serially connected between power VDD and VSS. The gates of transistors MP3 and MN2 are commonly connected and are supplied with the /RAS signal. The gates of transistors MP2 and MN1 are commonly connected and are supplied with an inverted output of latch circuit 5. The drains and sources of transistors MN1 and MN2 are connected with each other and the clock on signal is output from a contact of the drains.

Once the power source is supplied, the S2 signal is produced by the power-up generator as illustrated in FIG. 2, while the S1 signal which is the output of VBB sensor 1 is maintained at a low level until the back bias voltage VBB reaches the desired level. Since node C is maintained at a high level during this period, even if the /RAS signal falls to a low level, the /RAS signal cannot be supplied to the chip, so that the clock-on signal is continuously maintained at a low level.

Meanwhile, when the VBB signal reaches the desired level, the S1 signal is shifted to a high level by VBB sensor 1, and, accordingly, the levels of nodes A, B and C are inverted by the S1 signal. The levels of the nodes A, B and C are maintained "low", "high" and "low," respectively. Thereby, the input of the /RAS signal is transferred to the chip as a clock-on signal.

In this conventional /RAS clamping circuit, even if the VBB voltage reaches the desired level during the initial chip set-up, the sense amplifiers can malfunction upon supplying the /RAS signal, as long as the bit line pre-charge voltage has not reached a ½ VDD level.

Further, memory chips are being improved into larger scale devices. As the bit line loading capacitance is increased in accordance with an increase in the memory capacity, a longer time is needed to set up all of the bit lines with a bit line pre-charge voltage. Thus, malfunctions of the sense amplifiers can occur, which are caused by the supply of the /RAS signal before the set-up of the VBLP voltage. Such malfunctions degrade the reliability of the semiconductor memory devices.

SUMMARY OF THE INVENTION

The present invention is intended to overcome the above-described disadvantages of the conventional technique.

Therefore, it is an object of the present invention to provide a circuit for clamping an enable clock in a semiconductor memory device, comprising: a) means for producing a back bias voltage set-up signal when a back bias voltage has reached a back bias reference voltage level; b) means for producing a power-up signal when power is set-up; c) means for generating a bit line pre-charge voltage; d) controller means for holding the bit line pre-charge voltage to a ground voltage level according to the back bias set-up signal and the power-up signal; e) means for generating a bit line pre-charge voltage set-up signal when the bit line pre-charge voltage has reached a bit line pre-charge reference voltage level; f) enable clock pass signal generator means for producing an enable clock pass signal according to the bit-line set-up signal and the power-up signal; and g) means for transferring the enable clock according to the enable clock pass signal.

Further, wherein the controller means comprises: a) generator means according to the back bias voltage set-up signal and the power-up signal for generating a bit line pre-charge voltage control signal; and b) hold means for holding the bit line pre-charge voltage to ground voltage level according to the bit line pre-charge voltage control signal.

The generator means comprises: a) a latch having a pair of 2-input NOR gates, where the first 2-input NOR gate receives the back bias voltage set-up signal and an output signal of the second 2-input NOR gate, and the second 2-input NOR gate receives the power-up signal and an output signal of the first 2-input NOR gate; and b) an inverter is connected to the second 2-input NOR gate.

The enable clock pass signal generator means comprises: a) a latch having a pair of 2-input NOR gates, wherein the first 2-input NOR gate receives the bit line pre-charge voltage set-up signal and an output signal of the second 2-input NOR gate, and the second 2-input NOR gate receives the power-up signal and an output signal of the first 2-input NOR gate; and b) an inverter connected to the second 2-input NOR gate.

A further object is to provide a circuit for a clamping an /RAS signal in a dynamic random access memory which has a large bit line capacitance. In present invention, the bit line pre-charge voltage generator is activated after the set-up of the VBB voltage, and a /RAS signal may be supplied to the chip after the bit line pre-charge voltage VBLP has reached the desired level, thereby preventing malfunction of the sense amplifiers.

Accordingly, though only the VBB generator is activated, the /RAS input is not allowed to affect the chip, thereby assuring the reliability of the chip.

In achieving the above object, the circuit according to the present invention improves the conventional /RAS clamping circuit described above which has: VBB sensor 1, power-up generator 8, latch circuit 5, inverter 6 and NOR circuit 7. The circuit according to the present invention comprises: a VBB sensor for producing VBB set-up signal S1 when a back bias voltage VBB in the semiconductor memory device has reached a desired level; a power-up generator for producing a power-up signal S2 when power in the semiconductor memory device is set-up; a VBLP generator for generating a bit line pre-charge voltage VBLP; a VBLP controller for holding the VBLP to a ground voltage level according to the S1 and S2 signals; a VBLP sensor for generating VBLP set-up signal S3 when the VBLP has reached a desired level; and a /RAS pass signal generator for producing a /RAS pass signal S4 according to the S3 and S2 signals; a NOR circuit for controlling the transmission of the /RAS signal according to the S4 signal, whereby /RAS signals are supplied into the semiconductor memory device after the VBB voltage has reached the desired level and after the VBLP voltage has reached the desired level.

The VBLP controller comprises a switching transistor for short circuiting the output terminal of a VBLP generator to ground and a first latch for outputting a latched signal through an inverter to a gate of the switching transistor.

BRIEF DESCRIPTION OF THE DRAWINGS

The above object and other advantages of the present invention will become more apparent by describing its preferred embodiment in detail with reference to the attached drawings in which.

DESCRIPTION OF THE PREFERRED EMBODIMENT

Figure 1:
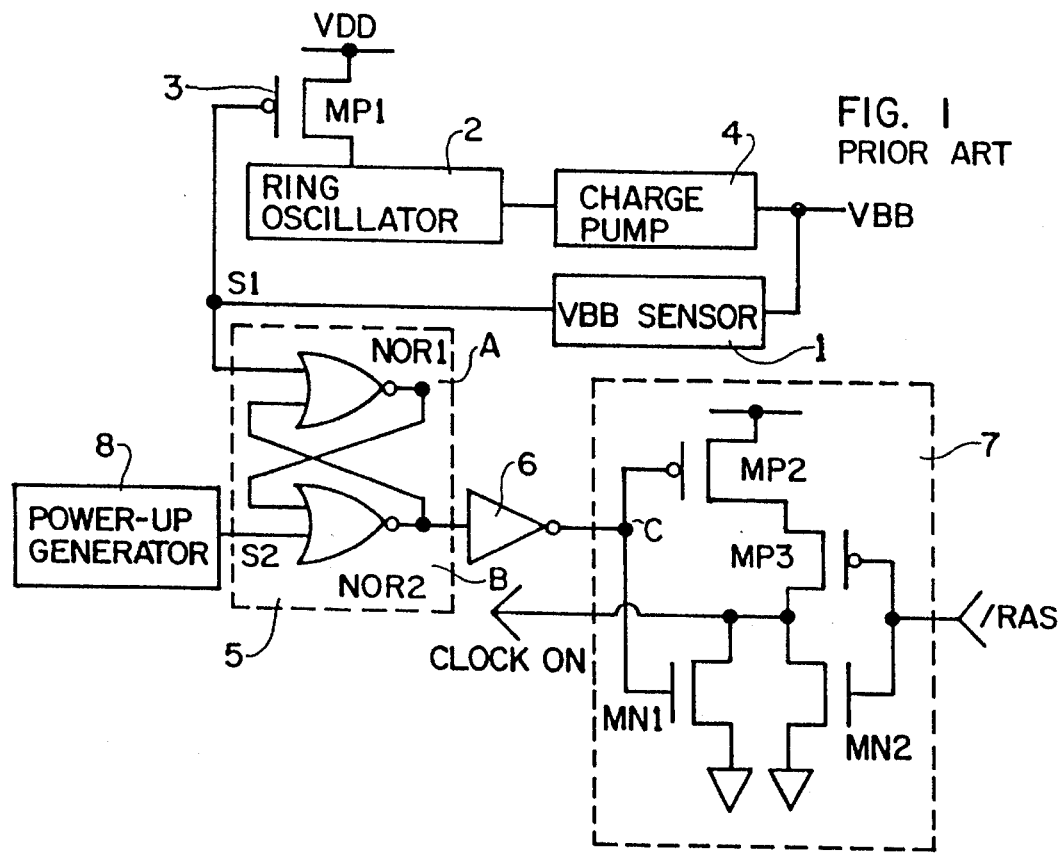
FIG. 1 illustrates a conventional circuit for clamping the row address strobe signals /RAS.
Figure 2:
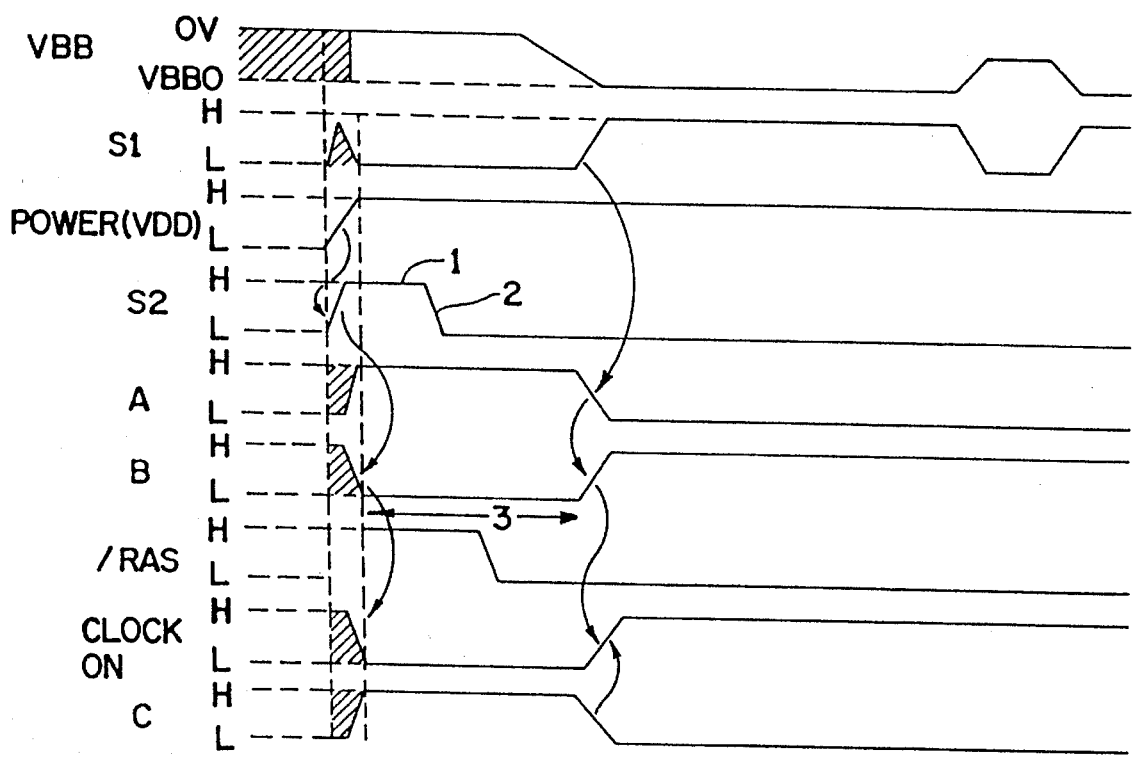
FIG. 2 is a timing chart for the conventional /RAS clamping circuit.
Figure 3:
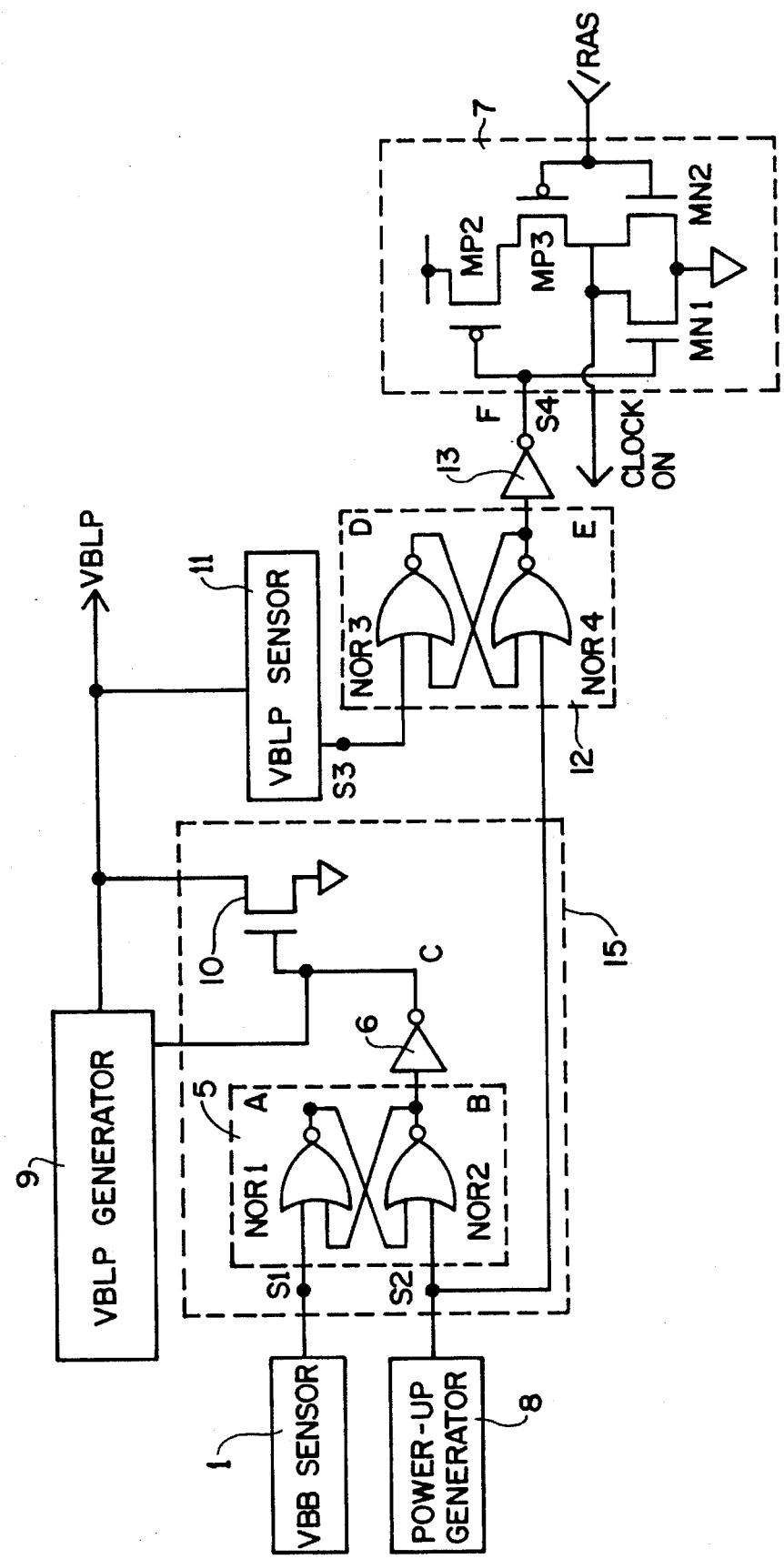
FIG. 3 illustrates a circuit for clamping the row address strobe signals according to the present invention.

FIG. 3 illustrates a circuit for clamping the /RAS signals as a preferred embodiment of the present invention.

As illustrated in FIG. 3, the output terminal of power-up generator 8 is connected to two terminals of first latch circuit 5 and an input of second latch circuit 12, while the output side of first latch circuit 5 is connected through inverter 6 to the gate of switching transistor 10, whose drain is connected to node VBLP and whose source is connected to ground.

Further, the output terminal of VBLP generator 9, which generates a bit line pre-charge voltage (VBLP), is connected to VBLP sensor 11 and to the drain of switching transistor 10, while the output terminal of VBLP sensor 11 is connected to the other side of second latch circuit 12, which consists of NOR gates NOR3 and NOR4.

The output terminal of second latch circuit 12 is connected through inverter 13 to one input of NOR circuit 7, which has two inputs, while the other input is connected to the /RAS signal, so that NOR circuit 7 transmits a clock-on signal in response to the /RAS signal.

VBB sensor 1 produces VBB set-up signal S1 when a back bias voltage VBB in the semiconductor memory device has reached a desired level. Power-up generator 8 produces power-up signal S2 when power in the semiconductor memory device is set-up. VBLP generator 9 generates bit line pre-charge voltage VBLP; VBLP controller 15 holds the VBLP node to ground voltage level according to the S1 and S2 signals; VBLP sensor 11 generates VBLP set-up signal S3 when the VBLP node has reached a desired level; and the /RAS pass signal generator produces a /RAS pass signal S4 according to the S3 and S2 signals. NOR circuit 7 controls the transmission of the /RAS signals according to the S4 signal. switching transistor 10 short-circuits the output terminal of VBLP generator 9 to ground.

Figure 4:
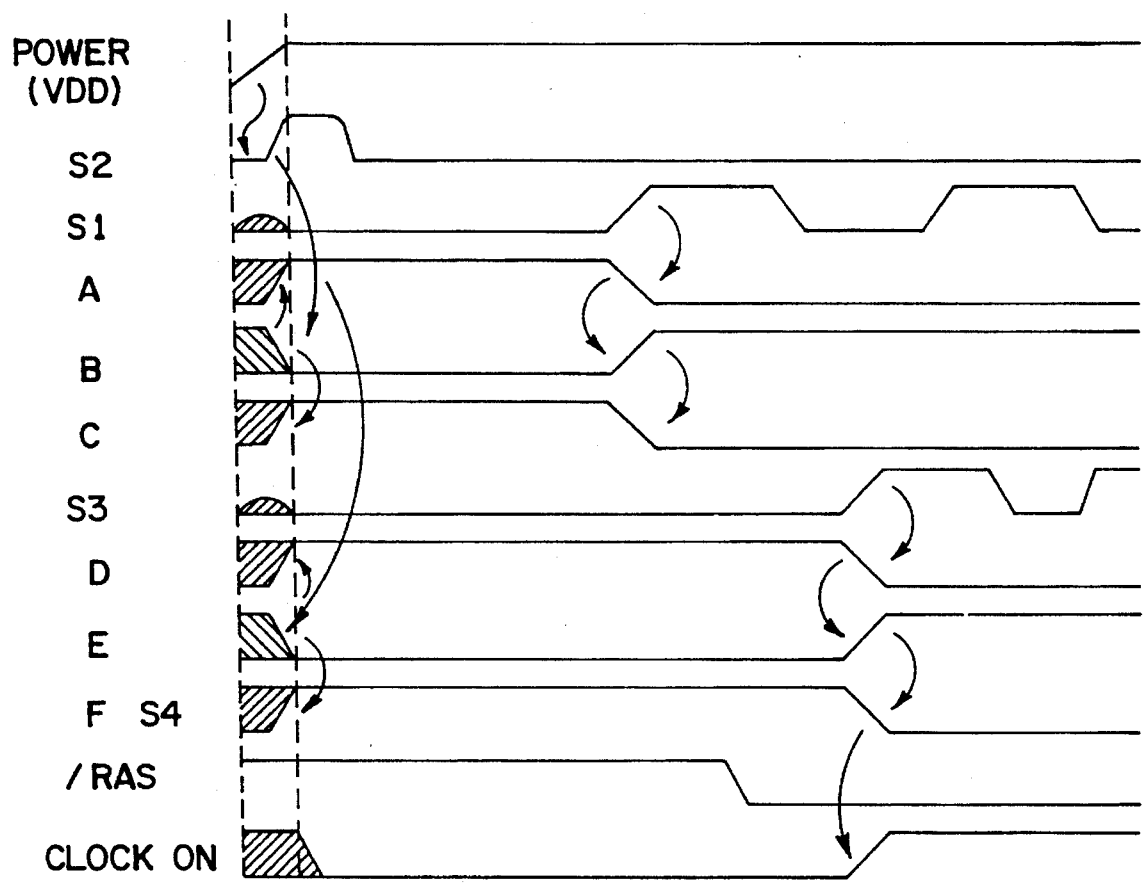
FIG. 4 is a timing chart for a /RAS clamping circuit according to the present invention.

FIG. 4 is a timing chart for the circuit for clamping the /RAS signals according to the present invention. In the circuit of the present invention, /RAS signals are transferred after the bit line pre-charge voltage (VBLP) is set up.

As illustrated by the wave pattern of FIG. 4, when power source VDD is supplied and stabilized, power-up signal S2 of power-up generator 8 is generated in the form of a pulse, and the VBB generator is activated. The S2 signal causes node B to be low. The output of first latch circuit 5 becomes low such that node A is high and node B is low, until the output signal of VBB sensor 1 (VBB set-up signal S1) becomes high.

The output of first latch circuit 5 is inverted by inverter 6, and switching transistor 10 is turned on, so that switching transistor 10 short-circuits the output node of VBLP generator 9 to ground. Thus, the voltage of the VBLP node is maintained at ground voltage.

Thereafter, when the VBB voltage is stabilized, VBB sensor 1 outputs the S1 signal as "HIGH", thus output node A of first latch circuit 5 drops to a low level. Then, NOR 2 output is "HIGH" and inverter 6 makes node C "LOW", and switching transistor 10 is turned off, and VBLP generator 9 is activated, so that a bit line pre-charge voltage is to be generated.

Until the VBLP voltage reaches the desired level, the output signal S3 of VBLP sensor 11 remains a "low" level, and node D and node E, outputs of the second latch circuit 12, and node F (signal S4), output of inverter 13, are respectively "high", "low", and "high" as illustrated in FIG. 4. Thus, transistor MP2 is off and transistor MN1 is on. Consequently, the /RAS signal cannot pass as a clock on signal.

Thereafter, when the VBLP voltage reaches the desired level, output signal S3 of VBLP sensor 11 is shifted to a high level, and node D and node E and signal S4 are shifted respectively to "low", "high", and "low" as illustrated in FIG. 4.

Thus, transistor MP2 is on and transistor MN1 is off. Consequently, the clock-on signal, which has remained at a low level regardless of the input of the /RAS signal, is turned to an inverted status value in accordance with the /RAS signal, and therefore /RAS signals are supplied to the chip only after the VBLP voltage is set up.

In order to reduce the time delay of supplying the /RAS signals into the chip, NOR circuit 7 is built with the transistors of MP2 and MN2 that have a big W/L ratio (ratio of width and length of the transistor gate), and thus are larger in current driving capacity as compared with transistors MP3 and MN1.

According to the present invention as described above, the /RAS signals are supplied after the bit line pre-charge voltage reaches a normal voltage as determined by the VBLP sensor. Further, the output of VBLP generator 9 is grounded through the operation of switching transistor 10 until the VBB voltage reaches a normal level.

As the bit line loading capacitance is increased in accordance with the increase in the memory capacity, a long time is needed to set up all bit lines with a bit line pre-charge voltage. Thus, there can occur malfunctions of the sense amplifiers which are caused by the supply of the /RAS signals before the set-up of the VBLP voltage.

However, in this invention, since the /RAS signals are supplied to the chip after the VBB and the VBLP voltages have reached the desired level, malfunctions of the sense amplifiers, which are caused by the supply of the /RAS signals before the set-up of the VBLP voltage, can be prevented.

Further, even if the voltage of the VBB generator or the voltage of the VBLP generator is varied, the input of the /RAS signals is not affected, so that the chip should be able to perform improved operations, thereby upgrading the reliability of the semiconductor memory device.

What is claimed is:

1. A circuit for clamping an enable clock in a semiconductor memory device, comprising:
   a) means for producing a back bias voltage set-up signal when a back bias voltage has reached a back bias reference voltage level;
   b) means for producing a power-up signal when power from a power supply is setup;
   c) means for generating a bit line pre-charge voltage;
   d) controller means for holding the bit line pre-charge voltage to a ground voltage level according to the back bias set-up signal and the power-up signal;
   e) means for generating a bit line pre-charge voltage set-up signal when the bit line pre-charge voltage has reached a bit line pre-charge reference voltage level;
   f) enable clock pass signal generator means for producing an enable clock pass signal according to the bit-line set-up signal and the power-up signal; and
   g) means for transferring the enable clock according to the enable clock pass signal.

2. A circuit according to claim 1, wherein the controller means comprises:
   a) generator means for generating a bit line precharge voltage control signal according to the back bias voltage set-up signal and the power-up signal; and
   b) holding the bit line pre-charge voltage to ground voltage level according to the bit line pre-charge voltage control signal.

3. A circuit according to claim 2, wherein the generator means comprises:
   a) a first latch comprising a pair of 2-input NOR gates, wherein a first 2-input NOR gate of the pair receives the back bias voltage set-up signal and an output signal of a second 2-input NOR gate of the pair, and the second 2-input NOR gate receives the power-up signal and an output signal of the first 2-input NOR gate; and
   b) an inverter connected to an output of the second 2-input NOR gate.

4. A circuit according to claim 1, wherein the enable clock pass signal generator means comprises:
   a) a second latch having a pair of 2-input NOR gates, wherein a first 2-input NOR gate of the pair, receives the bit line pre-charge voltage set-up signal and an output signal of a second 2-input NOR gate of the pair and the second 2-input NOR gate receives the power-up signal and an output signal of the first 2-input NOR gate; and
   b) an inverter connected to an output of the second 2-input NOR gate.

5. A circuit according to claim 1, wherein the bit line pre-charge voltage is ½ of the voltage level of the power supply.

6. A circuit according to claim 1, wherein the enable clock comprises a row address strobe signal.

7. A circuit for clamping /RAS signals in a semiconductor memory device, comprising:
   a VBB sensor for producing VBB set-up signal when a back bias voltage VBB in the semiconductor memory device has reached a desired level;
   a power-up generator for producing a power-up signal when power from a power supply in the semiconductor memory device is set-up;
   a VBLP generator for generating a bit line pre-charge voltage;
   a VBLP controller for holding the bit line pre-charge voltage to a ground voltage level according to the VBB set-up signal and the power-up signal;
   a VBLP sensor for generating a VBLP set-up signal when the bit line pre-charge voltage has reached a desired level;
   a /RAS pass signal generator for producing a /RAS pass signal according to the power-up signal and the VBLP set-up signal;
   a NOR circuit for controlling the transmission of the /RAS signals according to the /RAS pass signal;
   whereby the /RAS signals are supplied to the semiconductor memory device after the VBB voltage has reached the desired level and after the bit line pre-charge voltage has reached the desired level.

8. The circuit for clamping /RAS signals as claimed in claim 7, wherein the VBLP controller comprises:
   a switching transistor for short-circuiting the output terminal of the VBLP generator to ground;
   a first latch for outputting a latched signal through an inverter to a gate of the switching transistor.

9. The circuit for clamping /RAS signals as claimed in claim 7, wherein the /RAS pass signal generator comprises a second latch which has two inputs connected to receive the power-up signal and the VBLP set-up signal.

10. The circuit for clamping /RAS signals as claimed in claim 7, wherein the NOR circuit comprises first and second PMOS transistor and first and second NMOS transistors, wherein the first and second PMOS transistors and the second NMOS transistor are serially connected between a power supply terminal and a reference potential, wherein the gates of the second PMOS and second NMOS transistors are commonly connected and are supplied with the /RAS signal, wherein the gates of the first PMOS and first NMOS transistors are commonly connected and are supplied with an inverted output of latch circuit receiving as inputs the power-up signal and the VBLP set-up signal, wherein the drains of the first and second NMOS transistors are connected to each other and the sources of the first and second NMOS transistors are connected to each other, and a clock-on signal is output from the drains of the first and second NMOS transistors, wherein the first PMOS and the second NMOS transistors have large width/length ratios so as to have large current driving capacities as compared with those obtained by the second PMOS and first NMOS transistors.

11. A circuit for controlling an enable clock on an enable clock node in a semiconductor device, comprising:
   a power-up generator circuit, wherein the power-up generator circuit generates a power-up signal when the voltage provided to the semiconductor device from a power supply has reached a desired level;
   a back-bias voltage set-up circuit, wherein the back-bias voltage set-up circuit generates a back-bias set-up signal when a back-bias voltage of the semiconductor device has reached a desired level;

a precharge generator circuit for generating a precharge voltage signal on a precharge node;

a first control circuit coupled to receive the power-up signal and the back-bias set-up signal, wherein the first control circuit couples a reference potential to the precharge node in response to the power-up signal, and wherein the first control circuit decouples the reference potential from the precharge node and activates the precharge generator circuit in response to the back-bias set-up signal;

a precharge node sensor, wherein the precharge node sensor generates a precharge voltage set-up signal when the voltage on the precharge node reaches a desired level;

a second control circuit coupled to receive the precharge voltage set-up signal and the power-up signal, wherein the second control circuit couples a reference potential to the enable clock node in response to the power-up signal, and wherein the second control circuit decouples the reference potential from the enable clock node and couples the enable clock to the enable clock node in response to the precharge voltage set-up signal.

12. The circuit of claim 11, wherein the first control circuit comprises a NOR gate latch circuit receiving the power-up signal and the back-bias set-up signal as inputs, wherein the NOR gate latch is coupled to an inverter, wherein the inverter is coupled to the gate of an NMOS transistor and to the precharge generator circuit, wherein the NMOS transistor has its drain coupled to the precharge node and its source coupled to the reference potential.

13. The circuit of claim 11, wherein the second control circuit comprises a NOR gate latch circuit receiving the power-up signal and the precharge voltage set-up signal as inputs, wherein the NOR gate latch circuit is coupled to an inverter, wherein the inverter is coupled to a NOR gate output circuit, wherein the inverter is coupled to a first input of the NOR gate output circuit, and the enable clock is coupled to a second input of the NOR gate output circuit.

14. The circuit of claim 13, wherein the NOR gate output circuit comprises first and second PMOS transistors and first and second NMOS transistors, wherein the first and second PMOS transistors and the second NMOS transistor are serially connected between a power supply terminal and a reference potential, wherein the gates of the second PMOS and second NMOS transistors are connected to each other and coupled to receive the enable clock, wherein the gates of the first PMOS and first NMOS transistors are connected to each other and coupled to the inverter of the second control circuit, wherein the sources of the first and second NMOS transistors are connected to each other and to the reference potential, and wherein the drains of the first and second NMOS transistors are connected together and constitute the enable clock node.

15. The circuit of claim 14, wherein the first PMOS and the second NMOS transistors have large width/length ratios so as to have large current driving capacities as compared with those of the second PMOS and first NMOS transistors.

16. The circuit of claim 11, wherein the enable clock comprises a row address strobe signal.

17. The method of claim 16, wherein the enable clock comprises a row address strobe signal.

18. In a enable clock circuit of a semiconductor memory device, a method of coupling an enable clock to an enable clock node, comprising:

generating a power-up signal when the voltage received by the semiconductor memory device has reached a desired level;

generating a back-bias set-up signal when a back-bias voltage of the semiconductor device has reached a desired level;

coupling a precharge node to a reference potential in response to the power-up signal;

decoupling the precharge node from the reference potential and activating a precharge generation circuit coupled to the precharge node in response to the back-bias set-up signal;

generating a precharge set-up signal when the voltage on the precharge node has reached a desired level;

coupling the enable clock node to the reference potential in response to the power-up voltage; and coupling the enable clock node to the enable clock in response to the precharge set-up signal.

* * * * *